Oct. 24, 1961 M. P. WHITE ET AL 3,005,915

BISTABLE TRANSISTOR AMPLIFIER

Filed May 1, 1957

WITNESSES:

Bernard R. Gieguey

Myron E. Click

INVENTORS

Marshall P. White and

Russell J. Hall.

BY F. E. Browder

ATTORNEY 3,005,915

BISTABLE TRANSISTOR AMPLIFIER

Marshall P. White and Russell J. Hall, Cheektowaga, N.Y., assignors to Westinghouse Electric Corporation, East Pittsburgh, Pa., a corporation of Pennsylvania Filed May 1, 1957, Ser. No. 656,342
1 Claim. (Cl. 250—214)

This invention relates to transistor amplifiers in general and more particularly to bistable transistor amplifiers.

It is an object of this invention to provide an improved bistable transistor amplifier.

It is a further object of this invention to provide an improved bistable transistor amplifier which can be operated by a very small input signal.

A further object of this invention is to provide an improved bistable transistor amplifier which can be operated by radiation sensitive cells.

Other objects of this invention will become apparent from the following description when taken in conjunction with the accompanying drawings. In said drawings, for illustrative purposes only, there are shown preferred forms of this invention.

A junction type transistor comprises, in general, a body of semiconductive material having two zones of one conductivity type separated by a zone of the opposite conductivity type. Thus, the transistor may be either the N-P-N or P-N-P type. If the transistor is of the P-N-P type, the emitter electrode is normally biased positively to be in a relatively conducting or forward direction and the collector electrode biased negatively to be in a relatively non-conducting direction, each with respect to the base electrode. For the N-P-N type, these polarities are reversed. Junction type transistors are preferably employed in this invention, with the embodiments illustrated herein being of the N-P-N type although P-N-P types may be used.

Figure 1:
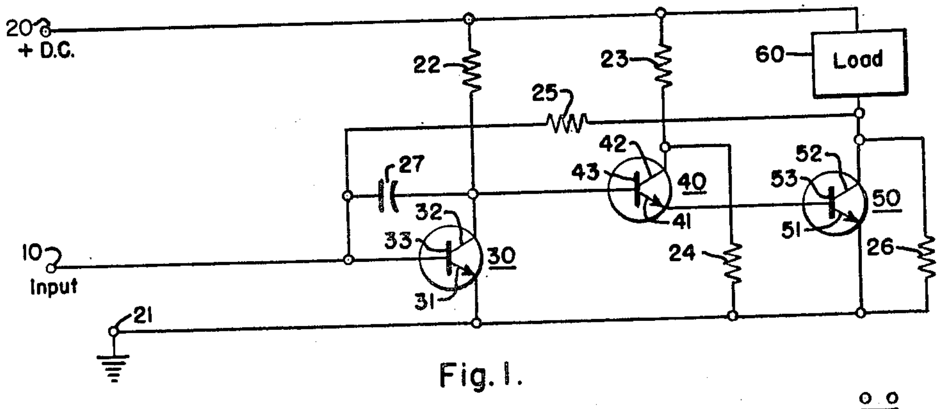
FIGURE 1 is a schematic diagram illustrating a bistable transistor amplifier embodying the teachings of this invention.

Referring to FIG. 1 there is illustrated a bistable transistor amplifier. In general, this bistable amplifier comprises means for applying an input to the amplifier at a terminal 10, three stages comprising transistors 30, 40 and 50, means for applying a direct current bias to the three transistor stages at a terminal 20 and means for connecting a load 60.

The transistor 30 comprises an emitter electrode 31, a collector electrode 32 and a base electrode 33. The base electrode 33 is connected to the terminal 10. A capacitor 27 is connected between the collector electrode 32 and the terminal 10. The collector electrode 32 is also connected to the terminal 20 via a resistor 22. The emitter electrode 31 is connected to a grounded terminal 21.

The transistor 40 comprises an emitter electrode 41, a collector electrode 42, and a base electrode 43. The base electrode 43 of the transistor 40 is connected to the collector electrode 32 of the transistor 30. The collector electrode 42 of the transistor 40 is connected to the terminal 20 via the resistor 23 and is also connected to the ground terminal 21 via the resistor 24.

The transistor 50 comprises an emitter electrode 51, a collector electrode 52 and a base electrode 53. The base electrode 53 of the transistor 50 is connected to the emitter electrode 41 of the transistor 40. The collector electrode 52 is connected to the terminal 20 through a load 60, to the ground terminal 21 through a resistor

26 and to the termminal 10 through a feedback resistor 25. The emitter electrode 51 is connected to the ground terminal 21.

The above illustrated embodiment being bistable presupposes two sets of operating conditions. The first condition is when there is no signal at the terminal 10. With no signal applied to the base electrode 33 of the transistor 30, it being of the N-P-N type and biased as shown, the transistor 30 will be non-conducting. Therefore, the potential of the collector electrode 32, as supplied by the positive direct current source connected to the terminal 20, through the resistor 22, will be large enough with respect to ground to cause a current to flow into the base electrode 43 of the transistor 40. Since the transistor 40 is of the N-P-N type this application of current to its base will furnish a proper bias with respect to the emitter electrode 41 and the collector electrode 42 of the transistor 40 to cause the transistor 40 to be conducting. The transistor 40, as illustrated in FIG 1, is being operated in the common collector configuration. Therefore, the current being supplied to the transistor 40, through the resistor 22, from the positive direct current source connected to the terminal 20 will be amplified by the transistor 40. This amplified current from the emitter electrode 41 of the transistor 40 will enter the base electrode 53 of the transistor 50 which operates as an output power stage. As before in the case of the transistor 40, the application of this amplified current to the base electrode 53 will furnish the proper bias to allow the N-P-N transistor 50 to conduct, thereby allowing current flow in the load 60 from the terminal 20 through the transistor 50 to the ground terminal 21.

In brief, the input stage transistor 30 and the output stage transistor 50 are being operated in the common emitter configuration utilizing the transistor 40 as a preamplifier stage for the output stage.

The second condition of operation is when a positive going signal is applied to the base electrode 33 of the transistor 30. This positive going signal furnishes the proper bias for the transistor 30 enabling it to conduct. Therefore, the potential of the collector electrode 32 with respect to ground will begin to decrease. This drop in potential of the collector electrode 32 will decrease the current that was being supplied to the base electrode 43 of the transistor 40, thereby reducing its base drive and decreasing its conduction.

The decrease in conduction of the transistor 40 will effect a decrease in turn of the amplified current supplied to the base electrode 53 of the transistor 50 thereby reducing the base drive and conduction of the transistor 50. With a decrease in conduction of the transistor 50, the potential with respect to ground of the collector electrode 52 will begin to rise toward the value of the voltage applied to the terminal 20. With a rise in potential with respect to ground of the collector electrode 52 additional current will flow through the feedback resistor 25 to the base electrode 33 of the transistor 30. This feedback current will drive the transistor 30 further into conduction producing a cascading effect throughout the bistable amplifier which will drive the transistor 30 into saturation.

With the transistor 30 thus saturated and conducting at its fullest, the potential with respect to ground of the collector electrode 32 of the transistor 30 will be very small. With the potential of the collector electrode 32 of the transistor 30 being very small it follows that the base drive of the transistor 40 and thus the transistor 50 will be reduced to a point to cut off conduction of the transistor 50. With the transistor 50 cut off, the voltage across the load 60 will be at some low value determined by the resistors 25 and 26, and the amplifier will be in the "off" state.

When the signal at the terminal 10 is decreased, this will decrease the base drive of the transistor 30. Therefore, the transistor 30 will conduct less current and the potential of the collector electrode 32 will begin to rise again toward the value of the voltage applied to the terminal 20. As hereinbefore described this will begin to furnish a base drive to the base electrode 43 of the transistor 40 which will start the transistor 40 conducting. The transistor 40 in turn supplies an amplified current to the base electrode 53 of the transistor 50 starting it to conduct. When the transistor 50 starts conducting, the potential with respect to ground of the collector electrode 52 will start to drop from its cut off value of nearly the voltage applied to the terminal 20. This decreases the feedback current through the feedback resistor 25 to the base electrode 33 of the transistor 30 thereby driving the transistor 30 further towards cut off. This initiates a cascading effect throughout the amplifier wherein the transistor 30 will be cut off and the transistors 40 and 50 will be at saturation. With the transistor 50 at saturation there will be a flow of current through the load 60 from the positive direct current source connected to the terminal 20 through the transistor 50 to the ground terminal 21 and the amplifier will be in the "on" state.

The resistor 22 determines the amount of current which will be supplied to the base electrode 43 of the transistor 40. The resistor 23 determines the amount of current supplied to the base electrode 53 of the transistor 50. The resistors 22 and 23, therefore, determine how far the transistors 40 and 50, respectively will be driven into saturation when there is no signal applied to the terminal 10. For maximum stability of the bistable amplifier, the resistor 22 must be small enough to allow the transistor 40 to be driven well into saturation. However, when the value of the resistor 22 is reduced the signal presented to the terminal 10 must be enlarged, reducing the sensitivity of the amplifier. The resistor 23 must be small enough to allow the transistor 50 to be kept in saturation during its conducting state or otherwise the circuit may tend to oscillate.

The resistor 24 is used to keep the potential of the collector electrode 42 of the transistor 40 from rising to the potential of the direct current source applied to the terminal 20 which may be above the rating of the transistor 40. The resistor 26 is used in the same manner for the transistor 50 as was the resistor 24 for the transistor 40. The choice of the proper value for the resistor 26 is important because, in combination with the feedback resistor 25, it will cause some voltage to exist across the load 60 in the "off" state of the bistable amplifier. The values of the resistors 24 and 26 will be determined by the voltage ratings of the transistors 40 and 50, respectively, and may be omitted if the voltage ratings are above the value of the direct current source connected to the terminal 20.

The feedback resistor 25 has its value determined by the amount of feedback current needed to provide sufficient base drive to the base electrode 33 of the transistor 30 for the proper switching action of the transistor 30. If the feedback resistor 25 is too small the transistor 30 will remain conducting during the on state for the amplifier unless a negative signal is applied to the terminal 10.

If the feedback resistor 25 is too large the circuit will not be bistable since sufficient current will not be fed back to drive the transistor 30 into saturation. The capacitor 27 stabilizes the bistable amplifier so that when the bistable amplifier switches it will not have the ability to oscillate between the off and on states.

Figure 2:
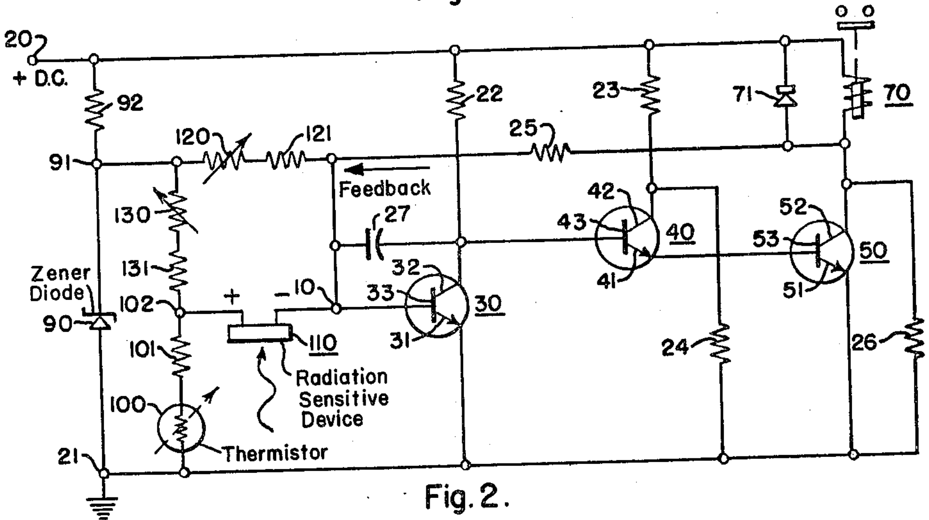
FIG. 2 is a second embodiment of the teachings of this invention.

Referring to FIG. 2 there is illustrated another embodiment of the teachings of this invention, in which like components of FIGS. 1 and 2 have been given the same reference characters. The main distinction between the apparatus illustrated in FIGS. 1 and 2 is that in FIG. 2 the load 60 has been replaced by a relay 70 and a uni-directional current device 71 connected in parallel circuit relationship. A resistor 92 and a semiconductor diode 90, of the Zener type, have been connected in series circuit relationship between the terminals 20 and 21. An adjustable resistor 120 and a resistor 121 have been connected in series circuit relationship between the terminal 10 and a terminal 91. Also connected between the terminals 10 and 91 in series circuit relationship are an adjustable resistor 130, a resistor 131 and a radiation sensitive cell 110 of the photovoltaic type, such as a solar cell. A resistor 101 and a thermister 100 are connected in series circuit relationship between the terminal 21 and a terminal 102. As may be supposed from the use of the radiation sensitive cell 110 the apparatus illustrated in FIG. 2 is an embodiment of the invention for detecting a radiation such as that given off by hot metal. The output is used to energize a load which may be a relay coil of the relay 70 or other associated circuitry.

A stable voltage or potential at the terminal 91 is provided by the breakdown effect of the Zener type diode 90. The bridge type circuit composed of the resistor 101, the thermistor 100, the potentiometer or adjustable resistor 130, the potentiometer or adjustable resistor 120 and the base-to-emitter resistance of the transistor 30 is necessary because of the low voltage output of the cell 110. A voltage at the terminal 102 is tapped from the constant voltage provided at the terminal 91 and will be adjusted to be equal to the voltage at the terminal 10 if the cell 110 were not in the circuit. This voltage at the terminal 102 is adjusted by the adjustable resistor 130 and temperature compensated by the thermistor 100 because the voltage at the terminal 10 will tend to drop with an increasing temperature of the transistor 30.

The adjustable resistor 120 is adjusted to allow a current flow from the terminal 91 to make the transistor 30 conduct. Therefore, the bistable amplifier illustrated in FIG. 2 will be normally in a non-conducting or "off" state as concerning the load, in this case the relay 70. When the cell 110 is in the circuit, with the potential at the terminal 102 equal to that at the terminal 10, and is receiving no radiation, the bistable amplifier will stay in the normally "off" condition. If the cell 110 is now subjected to a radiation to which it is sensitive, a voltage will be generated at its terminals with a polarity as shown in FIG. 2. This voltage will decrease the potential at the terminal 10 while the voltage at the terminal 102 will remain essentially constant. This decrease in the voltage at the terminal 10 will start driving the transistor 30 towards cut off and driving the transistors 40 and 50 into saturation as described hereinbefore in the operation of the apparatus illustrated in FIG. 1. Since the remainder of the operation of the apparatus illustrated in FIG. 2 is the same as that of the appartus illustrated in FIG. 1, a further description of the operation is deemed unnecessary.

The unidirectional current device 71 is a discharge path for the relay coil of the relay 70 when the bistable amplifier turns "off" thereby preventing any high voltage surges across the transistor 50 which could damage this transistor. The resistors 121 and 131 are for current limiting purposes in case the adjustable resistors 120 and 130, respectively, are accidentally set at zero resistance. The bridge type arrangement discussed above gives a normally "off" type of operation for the bistable amplifier and thus for the relay 70 which is normally a fail-safe feature. The above-described circuit is very sensitive and has been experimentally operated with less than a 100 millivolt input signal generated by the cell 110.

Figure 3:
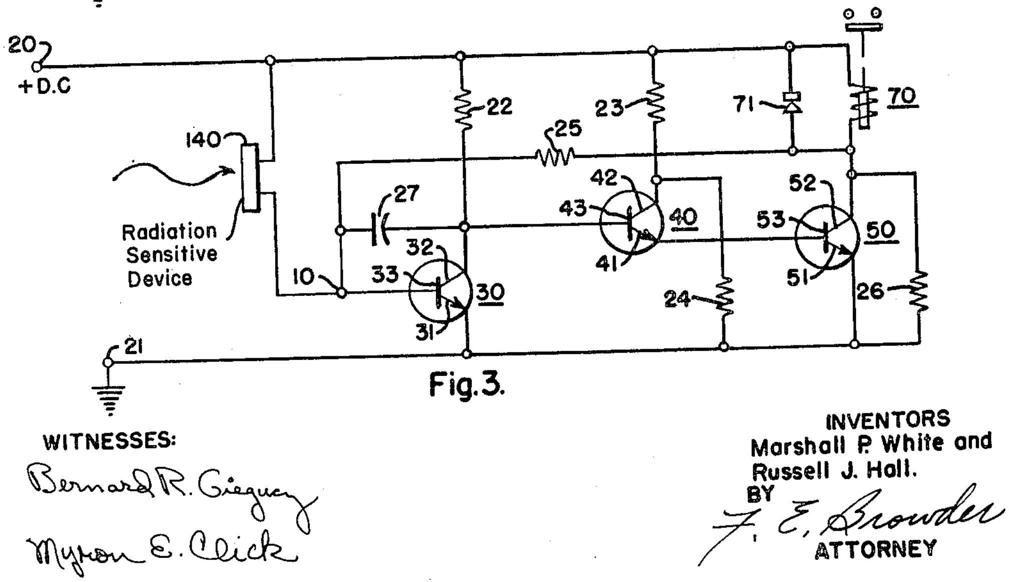
FIG. 3 is a third embodiment of the teachings of this invention.

Referring to FIG. 3 there is illustrated another embodiment of the teachings of this invention in which like components of FIGS. 1 and 3 have been given the same reference characters. The main distinction between the apparatus illustrated in FIGS. 1 and 3 is that in FIG. 3 a radiation sensitive cell 140, such as a cadmium selenide cell or lead sulphide cell has been connected between the terminal 10 and the terminal 20.

In general, the operation of the apparatus illustrated in FIG. 3 is the same as the operation of the apparatus illustrated in FIG. 1. With no radiation present the cell 140 will have a high impedance. Therefore, there will be no input to the base electrode 33 of the transistor 30 and the transistor 30 will be cut off while the bistable amplifier and thus the relay 70 will be "on." When the cell 140 picks up radiation to which it is sensitive its impedance will decrease causing a base current to flow from the terminal 20 into the transistor 30. As hereinbefore described this base current to the transistor 30 will switch the transistor 30 "on" and the bistable amplifier "off" and thus the relay "off."

It is to be pointed out that while the illustrated examples constitute practical embodiments of our invention, we do not limit ourselves to the exact details or applications shown, since modification of the same may be effected without departing from the spirit of this invention.

We claim as our invention:

A bistable amplifier sensitive to radiation energy and comprising a plurality of stages, each of said stages comprising a semiconductor device having a base, an emitter and a collector electrode, said plurality of stages comprising an input stage, a preamplifier stage and an output stage, means for applying an input signal to said input stage comprising a bridge type circuit of two parallel branches having a radiation sensitive voltage generating device connected across said bridge, said bridge type circuit being connected to a constant voltage source and including temperature compensating means, an input circuit of each said stage including said base electrode of said semiconductor device, an output circuit of each said stage including said emitter and collector electrodes of said semiconductor device, circuit means connecting the output circuit of each stage to an input circuit of a succeeding stage, means for applying a voltage to said output circuit of each of said stages, means for feeding back a control voltage from said output circuit of said output stage to said input circuit of said input stage, capacitor means connected between said output circuit and said input circuit of said input stage, and means for connecting a load to said output circuit of said output stage, with said radiation sensitive voltage generating device being operative when sensing radiation energy to generate a control voltage for causing said input stage to become non-conducting and thereby cause said output stage to energize said load.

References Cited in the file of this patent

UNITED STATES PATENTS

| | | |
|---|---|---|
| 2,683,806 | Moody | July 13, 1954 |
| 2,751,549 | Chase | July 19, 1956 |
| 2,773,219 | Aron | Dec. 4, 1956 |
| 2,774,875 | Keonjan et al. | Dec. 18, 1956 |
| 2,801,296 | Blecher | July 30, 1957 |
| 2,801,298 | Mital | July 30, 1957 |
| 2,848,658 | Mitchell | Aug. 19, 1958 |
| 2,925,559 | De Sautels | Feb. 16, 1960 |

FOREIGN PATENTS

| | | |
|---|---|---|
| 757,214 | Great Britain | Sept. 19, 1956 |